(12) United States Patent
Kim et al.

(10) Patent No.: US 8,351,215 B2
(45) Date of Patent: Jan. 8, 2013

(54) METHOD OF MANUFACTURING A CHIP EMBEDDED PRINTED CIRCUIT BOARD

(75) Inventors: Hong Won Kim, Suwon-si (KR); Sung Yi, Suwon-si (KR); Tae Sung Jeong, Hwaseong-si (KR); Joon Seok Kang, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 466 days.

(21) Appl. No.: 12/320,523

(22) Filed: Jan. 28, 2009

(65) Prior Publication Data

US 2010/0134991 A1 Jun. 3, 2010

(30) Foreign Application Priority Data

Dec. 1, 2008 (KR) .................. 10-2008-0120429

(51) Int. Cl.
*H05K 3/00* (2006.01)
(52) U.S. Cl. ........ 361/766; 341/748; 341/720; 341/761; 29/831; 29/832; 29/841; 29/842; 29/846
(58) Field of Classification Search .......... 361/763–766, 361/748, 720, 761; 29/831, 832, 841, 842, 29/846, 852
See application file for complete search history.

(56) References Cited

U.S. PATENT DOCUMENTS 5,432,677 A * 7/1995 Mowatt et al. ................ 361/719
5,875,100 A * 2/1999 Yamashita ..................... 361/764
7,755,910 B2 * 7/2010 Mashino ........................ 361/765
2010/0110638 A1 * 5/2010 Yumoto et al. ................ 361/709

FOREIGN PATENT DOCUMENTS

| JP | 2004-71998 | 3/2004 |
| JP | 2005-142466 | 6/2005 |
| JP | 2005-159199 | 6/2005 |
| JP | 2005-216936 | 8/2005 |
| KR | 10-2006-0046308 | 5/2006 |

OTHER PUBLICATIONS

Korean Office Action mailed Aug. 13, 2010 issued in corresponding Korean Patent Application No. 10-2008-0120429.
Korean Notice of Allowance mailed Feb. 1, 2011 issued in corresponding Korean Patent Application No. 10-2008-0120429.

* cited by examiner

*Primary Examiner* — Tuan T Dinh
*Assistant Examiner* — Hung Dang

(57) ABSTRACT

The present invention relates to a chip embedded printed circuit board and a manufacturing method thereof. The present invention provides the chip embedded printed circuit board including an insulating layer embedding a chip provided with posts at an upper part, vias formed through the insulating layer, upper patterns formed at the upper part of the insulating layer to be connected to the posts and the vias and lower patterns formed at a lower part of the insulating layer to be connected to the vias, and the manufacturing method thereof.

8 Claims, 2 Drawing Sheets

METHOD OF MANUFACTURING A CHIP EMBEDDED PRINTED CIRCUIT BOARD

CROSS-REFERENCE TO RELATED APPLICATIONS

This application claims the benefit of Korean Patent Application No. 10-2008-0120429 filed with the Korea Intellectual Property Office on Dec. 1, 2008, the disclosure of which is incorporated herein by reference.

BACKGROUND OF THE INVENTION

1. Field of the Invention

The present invention relates to a chip embedded printed circuit board and a manufacturing method thereof; and, more particularly, to a chip embedded printed circuit board to form upper patterns connected to posts on an insulating layer and to form lower patterns by etching a copper foil after forming the insulating layer embedding a chip provided with the posts over the metal foil and a manufacturing method thereof.

2. Description of the Related Art

Recently, an electronic part has become high density and high performance to meet the needs of high performance and miniaturization of an electronic device. Therefore, the demand for a small-sized printed circuit board capable of mounting the electronic parts at high density is gradually increasing. In response to this demand, development of a multi-layer circuit board for electrically connecting wirings formed on different layers or the electronic part and the wiring through a via hole is proceeding.

Such a multi-layer circuit board can realize a high-density wiring as well as reduce the wiring for connection between the electronic parts. In addition, it can not only increase a surface area of the printed circuit board but improve an electrical characteristic by mounting the electronic part.

Particularly, since in an embedded printed circuit board inserting an electronic part into a substrate, the electronic part is not mounted on the surface of the substrate but embedded inside the substrate, miniaturization, high density and high performance of the substrate can be achieved and thus the demand thereof is gradually increasing.

In a conventional chip embedded printed circuit board, a chip is positioned after a perforated core substrate is attached to a tape and the tape is separated after laminating an insulating layer, e.g., a prepreg layer on a surface opposite to a tape-attached surface. Thereafter, the prepreg layer is also laminated on a surface on which the tape is separated.

Then, a via hole is formed at a position needing electric connection by a laser drill method, or the like and a copper plating process or the like are performed.

However, it is difficult for the conventional chip embedded printed circuit board embedding the chip by using the tape inside the perforated core substrate to reduce the entire thickness of the substrate. Further, in case that the via hole is formed by the laser drill method or the like, it is difficult to process the via hole at an exact position due to a position tolerance of the chip or a tolerance of laser drill, which cause a connection failure, thereby deteriorating yield and reliability.

SUMMARY OF THE INVENTION

The present invention has been proposed in order to overcome the above-described problems and it is, therefore, an object of the present invention to provide a chip embedded printed circuit board and a manufacturing method thereof capable of reducing the entire thickness of a substrate and improving yield and reliability of a product by forming upper patterns connected to posts on an insulating layer and forming lower patterns by etching a copper foil after forming the insulating layer embedding a chip provided with the posts over the metal foil.

In accordance with one aspect of the present invention to achieve the object, there is provided a chip embedded printed circuit board including: an insulating layer embedding a chip provided with posts at an upper part; vias formed through the insulating layer; upper patterns formed at the upper part of the insulating layer to be connected to the posts and the vias; and lower patterns formed at a lower part of the insulating layer to be connected to the vias.

Herein, the chip embedded printed circuit board further can include an insulating film formed between a bottom surface of the insulating layer and top surfaces of the lower patterns.

And, the insulating film can be made of polyimide.

Further, the posts can be made of any one of copper, aluminum, and solder.

Further, the insulating layer can be made of any one of prepreg, ABF (Ajinomoto Build-up Film) and resin.

Further, the chip embedded printed circuit board further includes solder resist layers formed at upper and lower parts of the insulating layer to expose portions of the upper patterns and the lower patterns.

And, in accordance with another aspect of the present invention to achieve the object, there is provided a manufacturing method of a chip embedded printed circuit board including the steps of: mounting a chip provided with posts at an upper part over a metal film; forming an insulating layer penetrated by the chip provided with the posts over the metal foil; forming via holes to expose a portion of a top surface of the metal foil by removing a portion of the insulating layer; forming vias by filling the via hole with conductive material; forming upper patterns connected to the posts and the vias on the insulating layer; and forming lower patterns connected to the vias by removing a portion of the metal foil.

Further, the metal foil can be a copper foil.

Further, the method further includes a step of forming an insulating film on the metal foil before the step of mounting the chip provided with the posts at the upper part over the metal foil.

Further, the insulating film can be made of polyimide.

Further, the posts can be made of any one of copper, aluminum, and solder.

Further, the posts can be formed on the chip by a plating or printing method.

Further, the insulating layer can be made of any one of prepreg, ABF (Ajinomoto Build-up Film) and resin.

Further, the method further includes a step of performing a grinding process to expose top surfaces of the posts after the step of forming the insulating layer penetrated by the chip and the posts over the metal foil.

Further, the metal foil can be removed by an etching method in the step of forming the lower patterns connected to the vias by removing the portion of the metal foil.

Further, the method further includes a step of forming solder resist layers at upper and lower parts of the insulating layer to expose portions of the upper patter and the lower patterns after the step of forming the lower patterns connected to the vias by removing the portion of the metal foil.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

A matter regarding to an operation effect including a technical configuration for the object of a chip embedded printed circuit board and a manufacturing method thereof in accordance with the present invention will be appreciated clearly through the following detailed description with reference to the accompanying drawings illustrating preferable embodiments of the present invention.

A chip embedded printed circuit board in accordance with an embodiment of the present invention will be described in detail with reference to FIG. 1.

Figure 1:
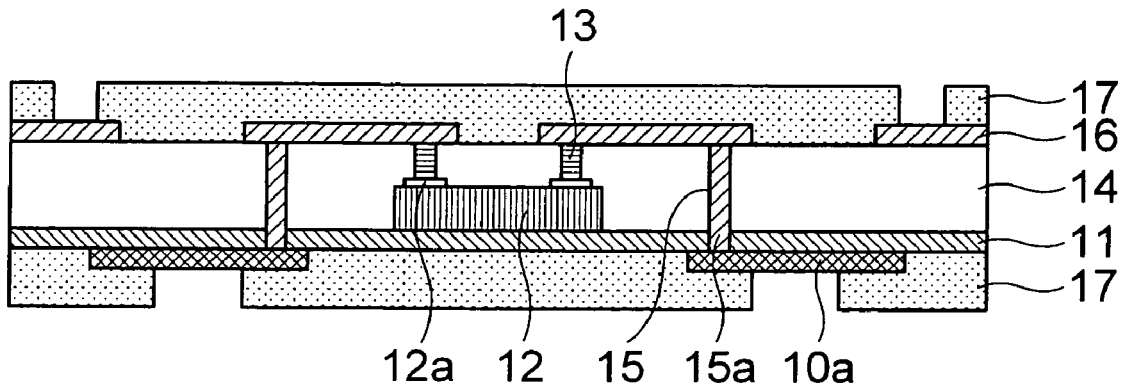
FIG. 1 is a cross-sectional view illustrating a structure of a chip embedded printed circuit board in accordance with an embodiment of the present invention.

FIG. 1 is a cross-sectional view illustrating a structure of a chip embedded printed circuit board in accordance with the embodiment of the present invention.

As shown in FIG. 1, in accordance with the embodiment of the present invention, the chip embedded printed circuit board includes an insulating layer 14 embedding a chip provided with posts 13 at an upper part, vias 15a formed through the insulating layer 14, upper patterns 16 formed at the upper part of the insulating layer 14 to be connected to the posts 13 and the vias 15a, and lower patterns 10a formed at a lower part of the insulating layer 14 to be connected to the vias 15a.

The posts 13 are formed on pads 12a provided at an upper part of the chip 12 by a plating method, a printing method or the like, wherein it is preferable that the posts 13 are made of copper.

Further, the posts 13 can be made of aluminum, solder or the like other than the copper.

And, the insulating layer 14 embedding the chip 12 provided with the posts 13 can be made of prepreg, ABF (Ajinomoto Build-up Film), resin or the like.

Herein, an insulating film 11 is additionally formed between a bottom surface of the insulating layer 14 and top surfaces of the lower patterns 10a. The insulating film 11 can be made of a PI (PolyImide) tape and so on and play a role of mounting and fixing the chip 12 by forming an adhesion layer.

The vias 15a are formed through the insulating layer 14 at portions where the chip 12 is not formed inside the insulating layer 14 and electrically connected to the lower patterns 10a by penetrating the insulating film 11 formed at a lower part of the insulating layer 14.

It is preferable that the vias 15a, the lower patterns 10a and the upper patterns 16 are made of conductive material such as copper.

Solder resist layers 17 are formed at upper and lower parts of the insulating layer 14. At this time, the solder resist layers 17 are partially removed to expose portions of the upper patterns 16 and the lower patterns 10a.

An external connection unit, e.g., a solder ball (not shown in the drawing) can be formed at portions of the upper patterns 16 and the lower patterns 10a which are exposed by removing the solder resist layers 17.

Particularly, in the chip embedded printed circuit board in accordance with the embodiment of the present invention, electrical connection between the chip 12 and the upper patterns 16 is implemented by the posts 13 which are formed on the pads 12a of the chip 12.

In other words, the chip embedded printed circuit board in accordance with the embodiment of the present invention can improve reliability and reduce manufacture time and process by omitting a conventional via forming process for connection between the chip 12 and the patterns or the like by forming the upper patterns 16 directly electrically connected to the posts 13 on the insulating layer 14 after forming the chip 12 provided with the posts 13 at the upper part through the insulating layer 14.

Further, the chip embedded printed circuit board in accordance with the embodiment of the present invention has a structure in which the upper patterns 16 and the lower patterns are directly formed at the upper and lower parts of the insulating layer 14 embedding the chip 12 and therefore it is possible to implement the chip embedded printed circuit board having a two-layered structure in which the total number of layers for arranging the upper patterns 16 and the lower patterns 10a is two.

Accordingly, in accordance with the embodiment of the present invention, it is possible to remarkably reduce the entire thickness of the chip embedded printed circuit board, thereby achieving miniaturization of the chip embedded printed circuit board.

Hereafter, a manufacturing method of a chip embedded printed circuit board in accordance with the embodiment of the present invention will be described in detail with reference to FIGS. 2 to 9.

FIGS. 2 to 9 are cross-sectional views sequentially illustrating the manufacturing method of the chip embedded printed circuit board in accordance with the embodiment of the present invention.

Figure 2:
FIGS. 2 to 9 are cross-sectional views sequentially illustrating a manufacturing method of a chip embedded printed circuit board in accordance with an embodiment of the present invention.

At first, as shown in FIG. 2, a metal foil 10 is prepared. Herein, the metal foil 10 can employ a copper foil and so on.

Figure 3:
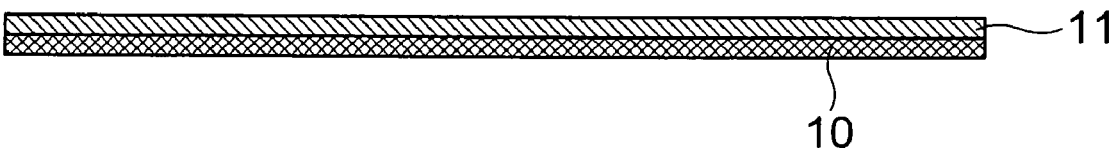

Then, as shown in FIG. 3, an insulating film 11 is formed on the metal foil 10. The insulating film can be made of a polyimide tape and so on and play a role of mounting and fixing a chip (see "12" shown in FIG. 4) by forming an adhesion layer.

Figure 4:
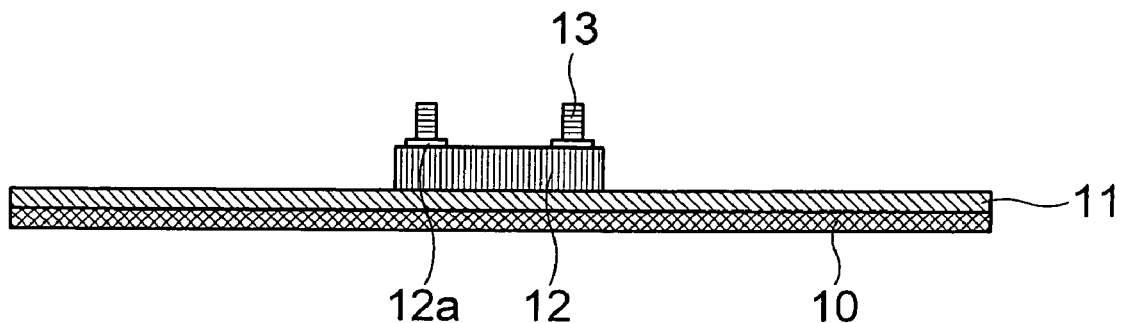

Then, as shown in FIG. 4, after mounting the chip 12 on the insulating film 11, posts 13 are formed at an upper part of the chip 12.

The posts 13 can be formed on pads 12a provided at the upper part of the chip 12 by a plating method, a printing method, or the like. At this time, the posts 13 are preferably made of copper and can be made of aluminum, solder or the like instead of the copper.

Herein, as described above, although the posts 13 are formed on the chip 12 while the chip 12 is mounted on the insulating film 11, the posts 13 can be formed on the chip 12 before mounting the chip 12 on the insulating film 11.

Figure 5:
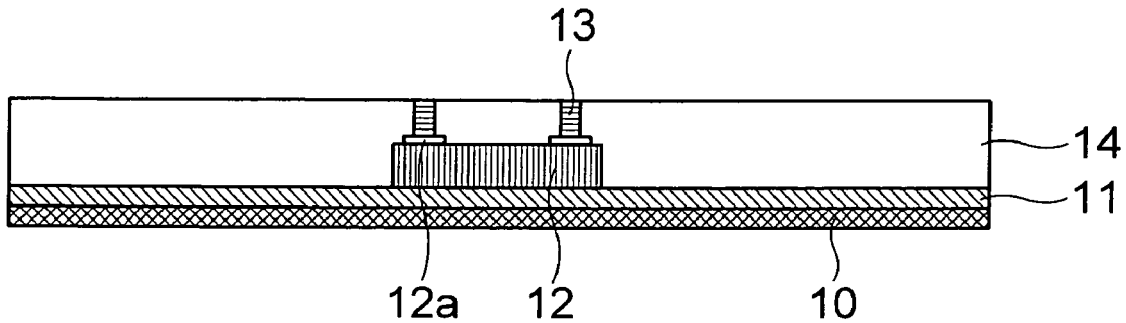

Then, as shown in FIG. 5, an insulating layer 14 is stacked on the insulating film 11 to be penetrated by the chip 12 provided with the posts 13. The insulating layer 14 can be made of prepreg, ABF (Ajinomoto Build-up Film), resin or the like.

After stacking the insulating layer 14, an additional grinding process can be performed so that top surfaces of the posts 13 are smoothly opened.

Figure 6:
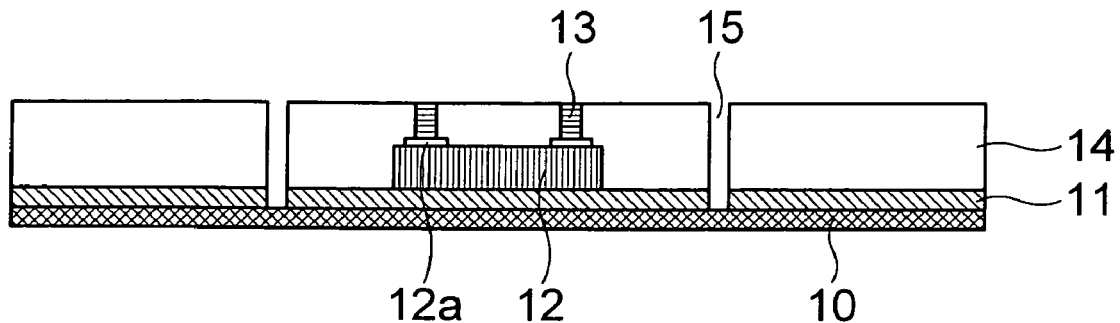

Then, as shown in FIG. 6, via holes 15 are formed to expose a portion of a top surface of the metal foil 10 by removing a portion of the insulating layer 14. When forming the via holes 15, the insulating film 11 of a lower part of the insulating layer 14 is removed together in order to expose the top surface of the metal foil 10.

Herein, the via holes 15 can be processed by a method such as a CNC (Computer Numerical Control) drill or laser drill.

Figure 7:
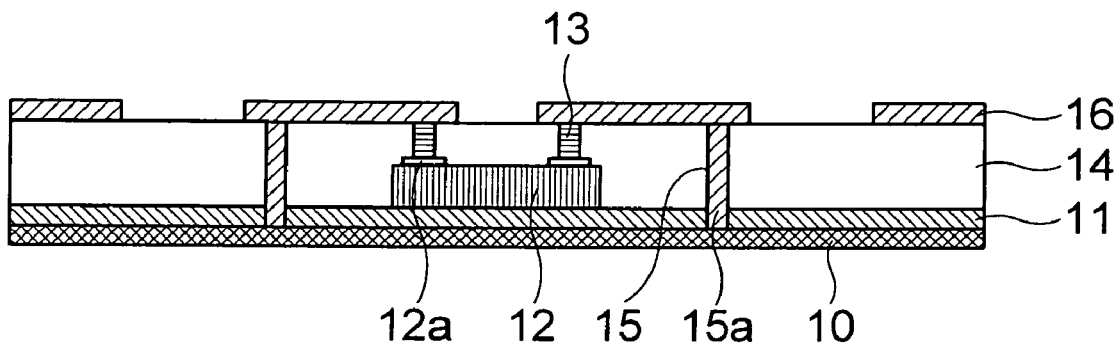

Then, as shown in FIG. 7, vias 15a are formed by filling the via holes 15 with conductive material such as copper and upper patterns 16 connected to the posts 13 and the vias 15a are formed on the insulating layer 14.

Figure 8:
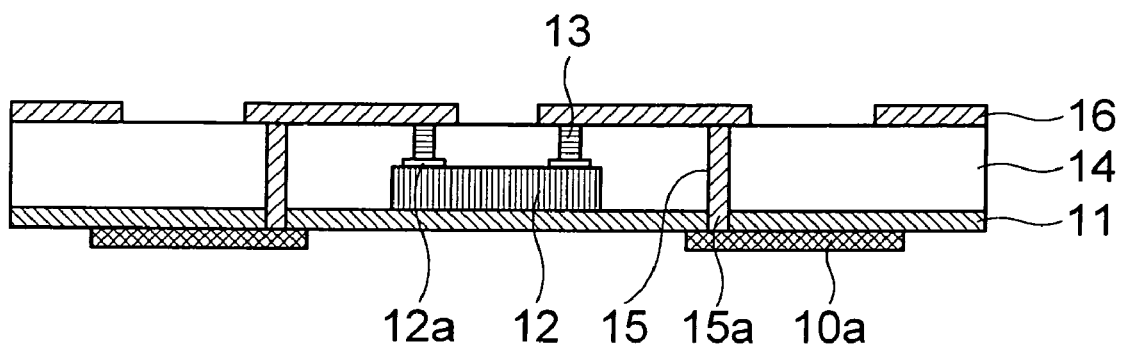

Thereafter, as shown in FIG. 8, lower patterns 10a connected to the vias 15a are formed by removing a portion of the metal foil 10 formed on a bottom surface of the insulating film 11 by an etching method or the like.

Figure 9:
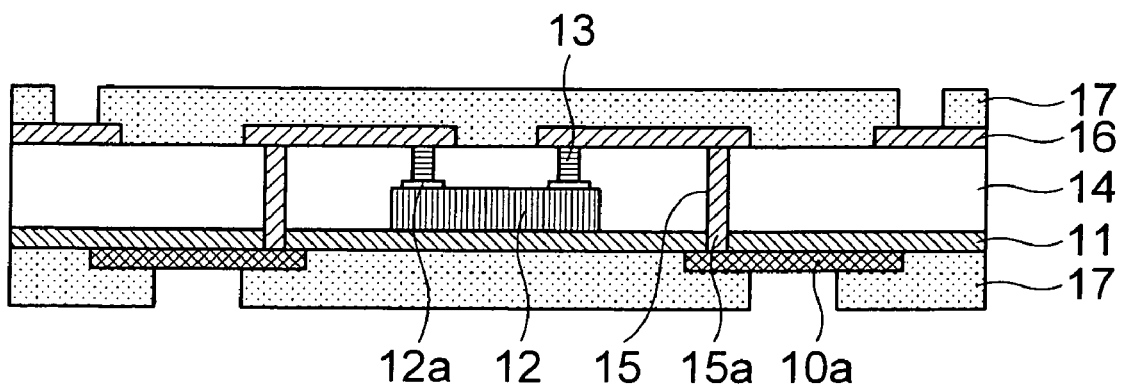

Then, as shown in FIG. 9, after forming solder resist layers 17 at upper and lower parts of the insulating layer 14, portions of the upper patterns 16 and lower patterns 10a are exposed by removing portions of the solder resist layers 17.

As described above, in accordance with the embodiment of the present invention, the manufacturing method of the chip embedded printed circuit board can simplify a process by omitting a conventional via forming process for connection between the chip 12 and the upper patterns 16 or the like by forming the upper patterns 16 directly connected to the posts 13 at the upper part of the insulating layer 14 and forming the lower patterns 10a at the lower part of the insulating layer 14 through the etching process of the metal foil 10 after mounting the chip 12 provided with the posts 13 over the metal foil 10 and stacking the insulating layer 14 penetrated by the chip 12 provided with the posts 13 over the metal foil, thereby improving manufacture yield and reliability of the chip embedded printed circuit board and reducing the manufacture cost.

Further, in accordance with the embodiment of the present invention, as described above, it is possible to implement the miniaturization of the chip embedded printed circuit board by dramatically reducing the entire thickness of the chip embedded printed circuit board.

As described above, the chip embedded printed circuit board and the manufacturing method thereof in accordance with the present invention have an advantage to remarkably reduce the entire thickness of the chip embedded printed circuit board by forming the upper patterns directly connected to the posts on the insulating layer and forming the lower patterns through the etching process of the metal foil after mounting the chip provided with the posts over the metal foil and stacking the insulating layer penetrated by the chip provided with the posts, thereby implementing the miniaturization of the substrate.

Further, the present invention can improve interlayer connection reliability by forming the posts on the chip and directly connecting the posts to the upper patterns, enhance the yield of the chip embedded printed circuit board and reduce the manufacture cost by simplifying the process without the need for the conventional via forming process for the interlayer connection or the like.

As described above, although the preferable embodiments of the present invention have been shown and described, it will be appreciated by those skilled in the art that substitutions, modifications and changes may be made in these embodiments without departing from the principles and spirit of the general inventive concept, the scope of which is defined in the appended claims and their equivalents.

What is claimed is:

1. A manufacturing method of a chip embedded printed circuit board comprising:
   forming an insulating film on a metal foil;
   mounting a chip having terminals on which posts are formed at an upper part over the insulating film, wherein forming the insulating film on the metal foil is performed before mounting the chip provided with the posts at the upper part over the metal foil;
   forming an insulating layer over the insulating film and the chip, top surfaces of the posts and all top surfaces of the insulating layer being on a same horizontal plane;
   forming via holes to expose a portion of a top surface of the metal foil by removing a portion of the insulating layer and the insulating film;
   forming vias by filling the via hole with conductive material;
   forming upper patterns connected to the posts and the vias on the insulating layer; and
   forming lower patterns connected to the vias by removing a portion of the metal foil,
   wherein all of the via holes formed in forming the via holes are located on an area except for a vertical upper area of the chip, and
   the posts are made of any one of copper aluminum and solder.

2. The method of claim 1, wherein the metal foil is a copper foil.

3. The method of claim 1, wherein the insulating film is made of polyimide.

4. The method of claim 1, wherein the posts are formed on the chip by a plating or printing method.

5. The method of claim 1, wherein the insulating layer are made of any one of prepreg, ABF (Ajinomoto Build-up Film) and resin.

6. The method of claim 1, further comprising performing a grinding process to expose top surfaces of the posts after the forming the insulating layer penetrated by the chip and the posts over the metal foil.

7. The method of claim 1, wherein the metal foil is removed by an etching method in the forming the lower patterns connected to the vias by removing the portion of the metal foil.

8. The method of claim 1, further comprising forming solder resist layers at upper and lower parts of the insulating layer to expose portions of the upper pattern and the lower patterns after the forming the lower patterns connected to the vias by removing the portion of the metal foil.

* * * * *